(12) United States Patent
Sommer et al.

(10) Patent No.: US 7,180,799 B2
(45) Date of Patent: Feb. 20, 2007

(54) CIRCUIT FOR SETTING ONE OF A PLURALITY OF ORGANIZATION FORMS OF AN INTEGRATED CIRCUIT AND METHOD FOR OPERATING IT

(75) Inventors: Michael Bernhard Sommer, Raubling (DE); Fabien Funfrock, München (DE)

(73) Assignee: Infineon Technologies AG, Munich (DE)

( * ) Notice: Subject to any disclaimer, the term of this patent is extended or adjusted under 35 U.S.C. 154(b) by 195 days.

(21) Appl. No.: 10/948,557

(22) Filed: Sep. 24, 2004

(65) Prior Publication Data
US 2005/0068813 A1    Mar. 31, 2005

(30) Foreign Application Priority Data
Sep. 26, 2003    (DE) ................. 103 44 874

(51) Int. Cl.
*G11C 7/00*    (2006.01)
(52) U.S. Cl. .................. 365/191; 365/148; 365/241
(58) Field of Classification Search ........... 365/191, 365/148, 241
See application file for complete search history.

(56) References Cited

U.S. PATENT DOCUMENTS

| | | | |
|---|---|---|---|
| 3,686,640 A | 8/1972 | Anderson et al. | |
| 6,240,030 B1 * | 5/2001 | Kang et al. | 365/201 |
| 6,577,546 B2 * | 6/2003 | Fujiwara et al. | 365/201 |
| 6,622,197 B1 | 9/2003 | Kim | |

* cited by examiner

*Primary Examiner*—Anh Phung
*Assistant Examiner*—Pho M. Luu
(74) *Attorney, Agent, or Firm*—Edell, Shapiro & Finnan, LLC

(57) ABSTRACT

A circuit for setting one of a plurality of organization forms of an integrated circuit includes a detector circuit connected to an external connection of the integrated circuit. The external connection in at least one of the organization forms can be used for external communication of the integrated circuit. A signal can be impressed into a signal path connected to the external connection by the detector circuit. As a consequence, an output signal is generated at an output of the detector circuit. A control circuit sets one of the organization forms and receives the output signal of the detector circuit. One of the organization forms is set by the control circuit depending on the state of the output signal of the detector circuit. A module with a detector circuit can identify that organization form of the organization forms in which it is operated in the application.

8 Claims, 3 Drawing Sheets

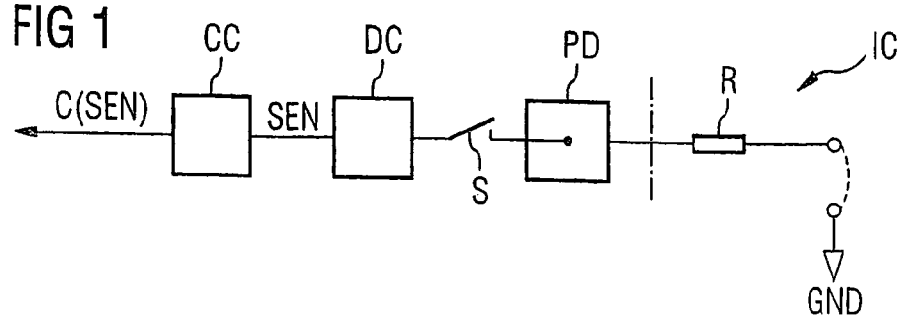
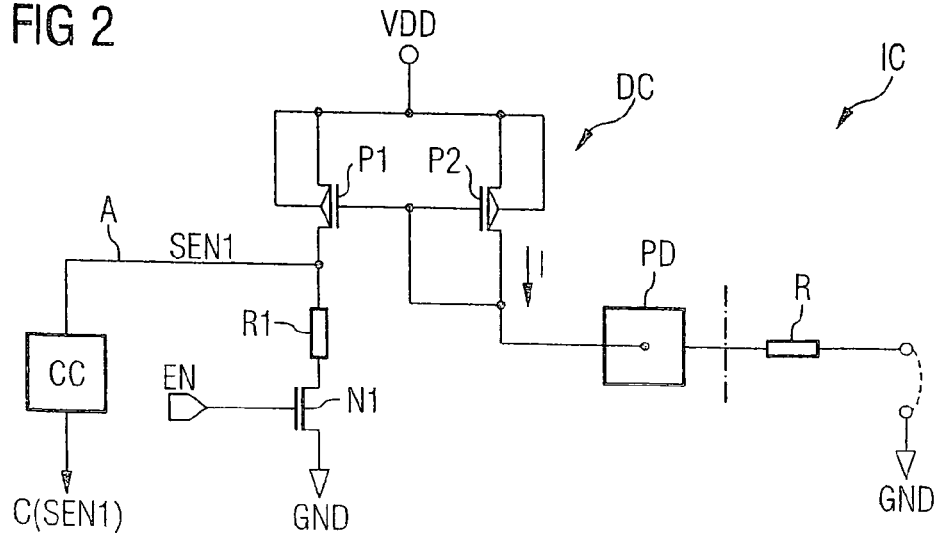
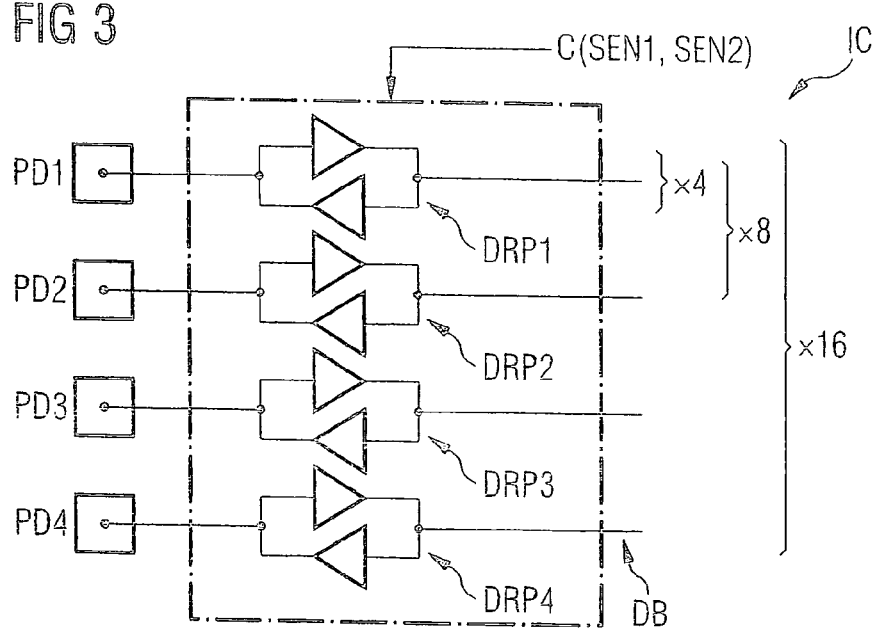

CIRCUIT FOR SETTING ONE OF A PLURALITY OF ORGANIZATION FORMS OF AN INTEGRATED CIRCUIT AND METHOD FOR OPERATING IT

CROSS REFERENCE TO RELATED APPLICATIONS

This application claims priority under 35 USC §119 to German Application No. DE 103 44 874.8 filed on Sep. 26, 2003, and titled "Circuit For Setting One Of A Plurality Of Organization Forms Of An Integrated Circuit And Method For Operating It," the entire contents of which are hereby incorporated by reference.

FIELD OF THE INVENTION

This invention relates to a circuit for setting one of a plurality of organization forms of an integrated circuit that can be operated in a plurality of organization forms, and to a method for operating it.

BACKGROUND

Integrated circuits such as, for example, integrated memory circuits, are used in different data configurations or organization forms. The organization forms differ, in particular, in the number of data lines used, which are connected to data connection pads, i.e., I/O pads. With the selection of one of the organization forms that can be set, it is possible to set a system bus width predetermined by the surroundings. The circuit design of the module to be configured is uniform. The data connection pads provide external communication, in particular, for the exchange of data between the integrated circuit and a system controller, for example. There are, for example, ×4, ×8 and ×16 organization forms that use 4, 8 or 16 data lines per circuit or module for the data exchange.

If, in terms of its basic conception, an integrated circuit can be used in all ×4, ×8 and ×16 organization forms and can accordingly be configured in the data width of a data bus of the circuit, it becomes necessary to set the relevant organization form before the commissioning of the integrated circuit. A plurality of connection pads are generally provided for this purpose. The connection pads can be connected externally in order to define a respective organization form.

In order to set the three aforementioned organization forms of an integrated circuit, two connection pads, for example, which are connected in three different ways, are provided. For this purpose, the connection pads are either connected ground, for example, or left open. For example, for setting the respective organization forms, different states are generated. In the case where a first connection pad is connected to ground, in the case where a second connection pad is connected up to ground and in the case where both connection pads are left open. Each of the states is significant for an organization form.

Such a configuration of an integrated circuit defines that organization form of the organization forms in which the integrated circuit is operated in the application. It is thus necessary for the manufacturer of such an integrated circuit to already define, in the course of manufacture, that organization form of the organization forms in which the circuit is configured. Accordingly, the logistics for the individual respective circuit configurations have to be coordinated with the precise requirement of the individual configurations both on the part of the manufacturer and on the part of the customer. In particular, it is necessary to coordinate the manufacturing, storage and supply capacities for the individual configurations and also the ordering process with the precise requirement of the respective circuit configuration. Furthermore, it is necessary, when building up stocks for the individual circuit configurations, to make a relatively precise prediction of the future sales of the respective circuit configuration in order to be able to keep the stocks relatively low.

A DRAM memory in which refresh intervals and the organization form for data can be set differently is known. A memory register, for example, an MRS (Mode Register Set) register, is programmed externally. The MRS register generates decoded control signals that are used to drive a selection circuit for selection of the refresh intervals and a selection circuit for selection of the data organization. Depending on the programmed state of the MRS register, it is thus possible, by the selection circuits, to program different refresh intervals and different data organization forms for the DRAM memory.

Also a memory system having a variable setting of the organization form is known. The memory system comprises two memory segments, of which each segment has a word length of m/2 and a bit length of n/2, where m specifies the maximum word length and n specifies the maximum bit length. The memory system can be operated in a first organization form with a word length m and a bit length n/2 and in a second organization form with a word length m/2 and the bit length n. For selection of one of the two organization forms, external connections of the memory system are driven with different potentials or the external connections are short-circuited among one another in different ways.

A circuit for setting one of a plurality of organization forms of an integrated circuit which makes it possible to achieve a gain in flexibility with regard to the usability of the integrated circuit in the different organization forms is desirable.

SUMMARY

The circuit according to the invention for setting one of a plurality of organization forms of an integrated circuit has a detector circuit connected to an external connection of the integrated circuit. In this case, it is possible to use the external connection in at least one of the organization forms during operation of the integrated circuit for external communication thereof. The detector circuit is formed such that, by the detector circuit, a signal can be impressed into a signal path connected to the external connection. As a consequence, an output signal is generated at an output of the detector circuit. Furthermore, a control circuit for setting one of the organization forms is provided having an input that receives the output signal of the detector circuit. One of the organization forms of the integrated circuit is set by the control circuit in a manner dependent on the state of the output signal of the detector circuit.

The circuit according to the invention for setting one of a plurality of organization forms of an integrated circuit is, for example, activated in an initialization mode of the integrated circuit in order, by the control circuit, to set one of the organization forms in a manner dependent on the output signal of the detector circuit. If the circuit according to the invention for setting one of a plurality of organization forms is provided on the integrated circuit itself, this makes it possible for the respective circuit module itself to identify that organization form of the organization forms in which the module is operated in the application. For example, if four or eight of 16 data lines present per circuit module are used in the application for the external communication of the module, the circuit according to the invention can be used to identify whether an external connection of the module is used for external communication or, by contrast, is not connected to external communication components on the circuit board in the application. Such unused external connections of a module are soldered onto the circuit board in the application, for example, such that the unused external connections have a floating potential state or are connected with high impedance to a fixed potential if leakage currents or the like lead to a certain conductivity. In this case, an initialization routine checks, for example, whether the different connection pads of the module are "floating" or are connected with low impedance to a fixed potential. The latter case may provide information about the fact that an external connection pad is intended to be used in the application for external communication.

Thus, initially the choice of the concrete organization form in the course of manufacture can be left open. The module with a circuit according to the invention is able itself to identify that organization form of the organization forms in which it is operated in the application, and sets the corresponding organization form via the control circuit. As a result, a manufactured module can still be used in the organization forms in the application, so that the logistics after the manufacture of the module do not have to be coordinated with the individual configurations. This results in a significant gain in flexibility with regard to the usability of a circuit module after the manufacture thereof.

The detector circuit generates at least one first and second state of the output signal. The first state is generated for the case where the external connection has a floating potential state or is connected with high impedance to a fixed potential. The second state is generated for the case where the external connection is connected with low impedance to a fixed potential. Consequently, with the output signal of the detector circuit, it is possible to directly ascertain the above-described interconnections of a connection pad in the application.

In one implementation, a current can be impressed into the signal path connected to the external connection by the detector circuit. By the current, a current or voltage signal can be generated as output signal of the detector circuit. For example, the detector circuit has a current mirror for this purpose. The input path of the current mirror is connected to the external connection. The output of the detector circuit is connected to the output path in order to tap off the output signal at the output path.

In another implementation, the detector circuit is formed as a driver/receiver circuit, which can be used during operation of the integrated circuit in at least one of the organization forms for external communication of the integrated circuit. In this case, it is possible to minimize the additional circuitry outlay for the circuit according to the invention for setting an organization form, since it is possible to use components already present in the form of the driver/receiver circuit as detector circuit.

In particular, by a driver of the driver/receiver circuit, a signal, for instance in the form of a logic signal, is impressed into the signal path connected to the external connection. A potential state of the external connection is detected by a receiver of the driver/receiver circuit. The potential state provides information about the external circuitry of the external connection. The output signal of the detector circuit can be tapped off at the receiver of the driver/receiver circuit.

The invention can be used in an integrated circuit as a memory circuit, for example, a DRAM memory. Consequently, according to the invention, one of the ×4, ×8 or ×16 organization forms (or a further organization form) can be set in a self-adjusting manner.

BRIEF DESCRIPTION OF THE FIGURES

The invention is explained in more detail below with reference to the figures illustrated in the drawing, which illustrate exemplary embodiments of the present invention.

FIG. 1 shows a schematic embodiment of a circuit for detecting an external interconnection of a connection pad of an integrated circuit according to the invention, FIG. 2 shows an embodiment of a detector circuit according to the invention, FIG. 3 shows an embodiment of an integrated circuit with driver/receiver circuits which can be operated in a plurality of organization forms.

DETAILED DESCRIPTION

Figure 4:
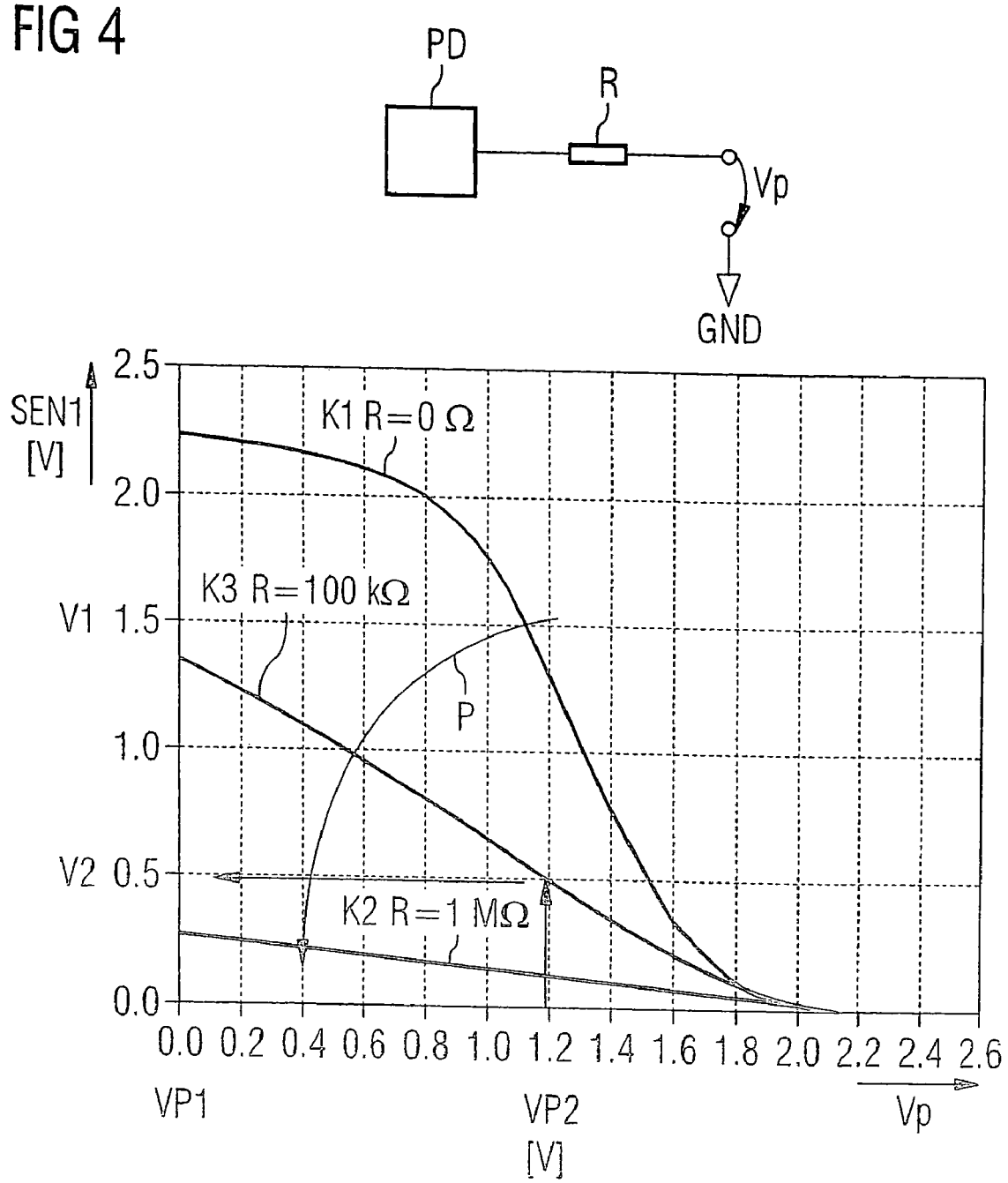
FIG. 4 shows a potential profile of an output signal of the detector circuit according to FIG. 2 for different termination potentials and different interconnections of the connection pad.

FIG. 1 illustrates a schematic embodiment of a circuit that can be used to detect an external interconnection of a connection pad of an integrated circuit according to the principle of the invention. A detector circuit DC can be connected, illustrated schematically by the switch S in the present embodiment, to an external connection of an integrated circuit in the form of a connection pad PD. The connection pad PD can be used in at least one of a plurality of organization forms during operation of the integrated circuit IC for external communication thereof, for example, for a data exchange with external circuit components. For this purpose, the connection pad PD is connected in the application to the external circuit components, which, are connected directly or indirectly to a supply voltage. For the case where the connection pad PD is not used for external communication in one of the organization forms, it is, for example, not connected up, i.e., "floating" state, in the application or, in the case of leakage currents or the like, is connected with high impedance to a fixed potential. It is furthermore conceivable that, in such a case, the connection pad PD is directly connected to the reference potential GND of the application. These and any other possibilities of the different external interconnection of the connection pad PD are symbolized in FIG. 1 symbolically by the equivalent resistance R. The magnitude of the equivalent resistance differs depending on the interconnection. The circuit according to the invention furthermore has a control circuit CC for setting one of the organization forms of the integrated circuit IC. The input of the integrated circuit IC receives the output signal SEN of the detector circuit DC. By the control circuit CC, one of the organization forms is set in a manner dependent on the state of the output signal SEN of the detector circuit DC by the control signal C.

FIG. 3 shows, schematically and in the fashion of an excerpt, an embodiment of an integrated circuit IC, which has an exemplary number of connection pads PD1 to PD4. The connection pads PD1 to PD4, for example, transmit data signals on a data bus DB. The connection pads PD1 to PD4 are connected to the data bus DB via respective driver/ receiver circuits DRP1 to DRP4. In the present exemplary embodiment, the integrated circuit IC illustrated is embodied as a memory circuit. In terms of its basic construction, it is designed, for example, for a ×4, ×8 and ×16 data input/data output organization form and accordingly has 16 data connection pads of which only four connection pads PD1 to PD4 are shown in FIG. 3, for the sake of clarity. In the present exemplary embodiment all the connection pads PD1 to PD4 are used for data transmission in the case of the ×16 organization form, only the connection pads PD1, PD2 are used in the ×8 organization form, and only the connection pad PD1 in the ×4 organization form. Accordingly, in the ×8 organization form, the driver/receiver circuits DRP3 and DRP4 are deactivated, under the control of the control signal C in a manner dependent on the output signal of the detector circuit, and additionally the driver/receiver circuit DRP2 in the ×4 organization form.

FIG. 2 shows a first embodiment of a detector circuit according to the invention. The detector circuit DC has a current mirror with a current source and a load element. The current source is formed by an NFET transistor N1, which is put into an on state by an activation signal EN. The load element is formed by the PFET transistors P1, P2, which are connected to the supply voltage VDD at their common connection. The transistor P1 is connected by its second connection of its controlled path to the resistor R1, which is connected to the transistor N1. At the output path of the current mirror thus formed, the output signal SEN1 can be tapped off at the node between the transistor P1 and the resistor R1, which forms the output A of the detector circuit DC. The signal is received by the control circuit CC at its input. The control circuit provides the control signal C for setting one of the organization forms in a manner dependent on the state of the output signal SEN1. The input path of the current mirror, which is formed by the controlled path of the transistor P2, is connected to the connection pad PD.

By the detector circuit DC thus formed, a current I is impressed into the signal path connected to the connection pad PD, so that the output signal SEN1 is generated in the form of a voltage signal at the output A of the detector circuit DC. The voltage signal depends, in particular, on the magnitude of the current I, the magnitude of which depends in turn on the magnitude of the equivalent resistance R. In this way, it is possible to generate different states of the voltage signal SEN1, depending on whether the connection pad PD has a floating potential state or is connected with high impedance to a fixed potential or the connection pad PD is connected with low impedance to a fixed potential.

FIG. 4 shows a potential profile of the output signal SEN1 of the detector circuit according to FIG. 2 for different termination potentials of the connection pad PD. In accordance with FIG. 4, the supply voltage VDD=2.5 V. For the case where the termination potential VP corresponds to the reference potential GND (VP1=0 V), different states of the output signal SEN1 of the detector circuit result depending on the magnitude of the resistance R. The solid curve K1 designates the potential profile for a resistance R=0 Ω. In this case, the connection pad PD is short-circuited directly with the reference potential GND. The dotted curve K2 shows the potential profile for the resistance R=1 MΩ. In this case, the connection pad PD is connected with high impedance to a fixed potential or is in a "floating" state. The dash-dotted curve K3 designates the potential profile for R=100 kΩ. The arrow P thus designates the change in the potential profile toward rising values of the resistance R.

Through a comparison of a reference potential of 1.5 V (V1), for example, with the potential of the signal SEN1, it can be established whether the connection pad PD is connected to the reference potential GND via a resistance R<100 kΩ. This makes it possible to draw conclusions about whether the connection pad PD is connected to the reference potential GND and, as a result, is not used for external communication of the integrated circuit. A comparison between a reference potential of 0.5 V (V2) and the potential of the signal SEN1 provides information about whether the connection pad PD is connected to the reference potential GND via a resistance R<900 kΩ. Furthermore, such a comparison may provide information about whether there is a connection of the connection pad PD via a resistance R<100 kΩ to a termination voltage VP=1.2 V (VP2). This permits the conclusion to be drawn as to whether, in accordance with the first case, the connection pad PD is "floating" or, in accordance with the second case, is connected to a termination voltage VP2 with a termination resistance (for example, amounting to 50 Ω in accordance with the characteristic impedance).

The described states of the signal SEN1, as described above, can be evaluated in respect of the way in which the connection pad PD is connected up, for example, in the application on a circuit board. At least two limit values V1, V2 may be defined for the evaluation of the output signal SEN1 of the detector circuit. It is possible to evaluate where the state of the output signal is in relation to said limit values. This makes it possible to establish the organization form in which the integrated circuit is intended to be operated in the application.

The concept of the detector circuit DC in accordance with FIG. 2 may be modified to the effect that it is also possible to measure or check the connection pad PD with regard to a connection to the supply voltage VDD. The same circuit construction may be used for this purpose, but the transistors P1 and P2 are to be embodied as NFET transistors and the transistor N1 is to be embodied as a PFET transistor. VDD would have to be connected to the transistor N1 and the transistors P1 and P2 would have to be connected to GND.

Figure 5:
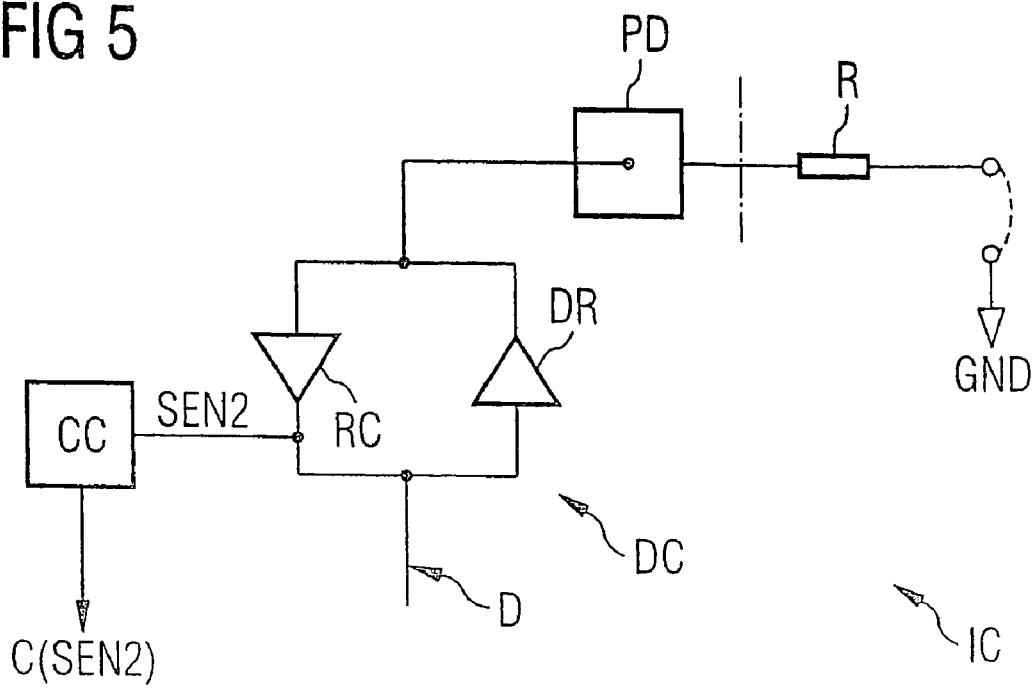
FIG. 5 shows a further embodiment of a detector circuit according to the invention.

FIG. 5 shows a further embodiment of a detector circuit according to the invention. The detector circuit DC is formed as a driver/receiver circuit which can be used during operation of the integrated circuit IC in at least one of the organization forms for external communication of the integrated circuit. The driver/receiver circuit according to FIG. 5 is identical to one of the driver/receiver circuits DRP1 to DRP4 in accordance with FIG. 3, in order, for example, to perform an external data exchange of the integrated circuit. In order to detect an external interconnection of the pad PD, by the driver DR of the driver/receiver circuit, a signal in the form of a logic signal D is impressed into the signal path connected to the connection pad PD. A potential state of the connection pad PD, which depends on the external interconnection of the connection pad PD, can be detected by the receiver RC of the driver/receiver circuit. The output signal SEN2 can be tapped off at the receiver RC and is fed to the control circuit CC in order to generate the control signal C for setting one of the organization forms in a manner dependent on the signal SEN2.

Figure 6:
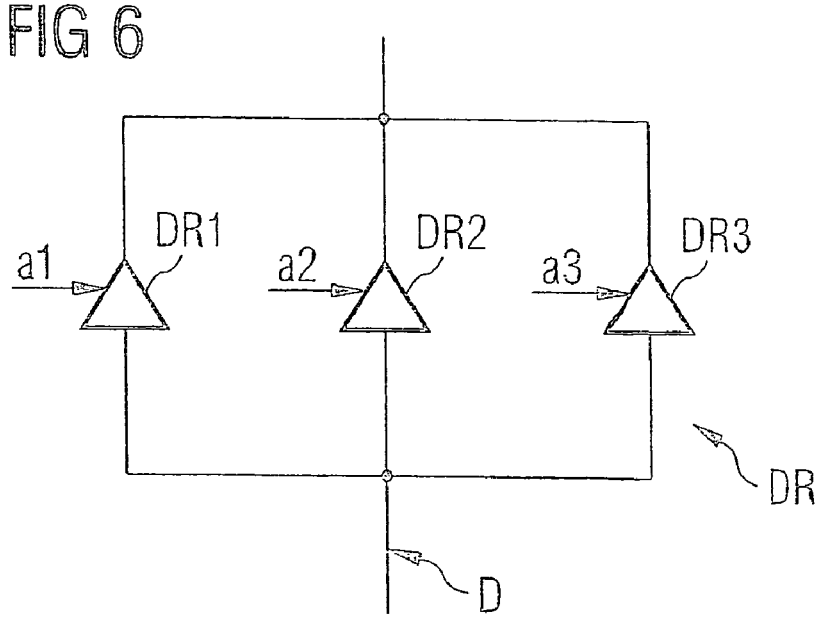
FIG. 6 shows an embodiment of a driver of the driver/receiver circuit in accordance with FIG. 5.

The driver DR in accordance with FIG. 5 is, for example, adjustable in terms of its driver strength. An exemplary embodiment of such a driver is illustrated in FIG. 6. The driver DR has a plurality of driver fingers DR1, DR2 and DR3, which can be activated and deactivated by a respective activation signal a1, a2 and a3. In order to be able to obtain information about the interconnection of the pad PD, the driver DR and the receiver RC in accordance with FIG. 5 are activated relatively simultaneously. The driver DR having a reduced driver strength, for example, only DR1 activated, writes a "1" in a first operating mode and a "0" in another operating mode. The following distinctions are to be made in this case:

The driver DR drives a "weak" "1", which the receiver RC identifies. It can be deduced from this that no current is flowing into the pad PD which, in the case of a weak driving of the "1", would have the effect that the "1" undergoes transition to a "0" (at least the potential level of the "1" is significantly reduced). For the case where the receiver RC identifies the "1", it can thus be deduced that the connection pad PD is not externally connected. For the case where the receiver RC does not identify the "1", it can be deduced that current is flowing and, consequently, the connection pad PD is externally connected. In the other operating case, the driver DR drives a "weak" "0". For the case where the receiver RC identifies the "0", no current is flowing, so that the conclusion can be drawn that the connection pad PD is not externally connected. If the receiver RC does not identify the "0", current is flowing, so that it is possible to draw the conclusion of a connection of the connection pad PD. A weak driving with a reduced driver strength is presupposed when driving the "0", too.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| IC | Integrated circuit |
| PD | Connection pad |
| R | Equivalent resistance |
| GND | Reference potential |
| VDD | Supply voltage |
| DC | Detector circuit |
| CC | Control circuit |
| A | Output |
| I | Current |
| P1, P2 | PFET transistor |
| N1 | NFET transistor |
| R1 | Resistor |
| SEN | Output signal |
| SEN1, SEN2 | Output signal |
| C | Control signal |
| PD1 to PD4 | Connection pad |
| DRP1 to DRP4 | Driver/receiver circuit |
| ×4, ×8, ×16 | Organization form |
| EN | Activation signal |
| VP | Termination voltage |
| V1, V2 | Reference potential |
| DR | Driver |
| RC | Receiver |
| D | Signal |
| DR1 to DR3 | Driver |
| a1 to a3 | Activation signal |
| S | Switch |
| DB | Data bus |
| VP1, VP2 | Termination voltage |
| K1 to K3 | Curve |

We claim:

1. A circuit for setting one of a plurality of organization forms of an integrated circuit, comprising:
a detector circuit connected to an external connection of the integrated circuit, the external connection in at least one of the organization forms being used for external communication thereof during operation of the integrated circuit, the detector circuit transmitting a first signal comprising a current into a signal path connected to the external connection, the current from the detector circuit generating a current or voltage signal as an output signal at an output of the detector circuit; and
a control circuit for setting one of the organization forms having an input that receives the output signal of the detector circuit, one of the organization forms being set by the control circuit depending on the state of the output signal of the detector circuit.

2. The circuit as claimed in claim 1, wherein the detector circuit generates at least one first and second state of the output signal, the first state being generated where the external connection has a floating potential state or is connected with high impedance to a fixed potential, and the second state being generated where the external connection is connected with low impedance to a fixed potential.

3. The circuit as claimed in claim 1, wherein the detector circuit has a current mirror having a current source, a load element, an input path, and an output path, the input path being connected to the external connection, the output of the detector circuit being connected to the output path in order to tap off the output signal at the output path.

4. The circuit as claimed in claim 1, wherein the detector circuit is formed as a driver/receiver circuit which can be used during operation of the integrated circuit in at least one of the organization forms for external communication of the integrated circuit.

5. The circuit as claimed in claim 4, wherein a driver of the driver/receiver circuit transmits a second signal into the signal path connected to the external connection, a potential state of the external connection being detected by a receiver of the driver/receiver circuit, and the output signal of the detector circuit being tapped off at the receiver.

6. The circuit as claimed in claim 5, wherein the driver of the driver/receiver circuit adjusts with regard to the driver strength, the driver being operated with a reduced driver strength.

7. A method for operating a circuit for setting one of a plurality of organization forms of an integrated circuit, the circuit including: a detector circuit connected to an external connection of the integrated circuit, the external connection in at least one of the organization forms being used for external communication thereof during operation of the integrated circuit, the detector circuit transmitting a first signal into a signal path connected to the external connection the detector circuit generating an output signal at an output the detector circuit; and a control circuit for setting one of the organization forms having an input that receives the output signal of the detector circuit, one of the organization forms being set by the control circuit depending on the state of the output signal of the detector circuit, the method comprising:
activating the circuit in an initialization mode of the integrated circuit via the control circuit in order to set one of the organization forms depending on the output signal of the detector circuit.

8. The method as claimed in claim 7, wherein, in order to evaluate the output signal of the detector circuit, at least two limit values are defined and an evaluation is effected with respect of where the state of the output signal is in relation to the limit values.

* * * * *